(12) United States Patent
Manabe et al.

(10) Patent No.: US 6,974,943 B2
(45) Date of Patent: Dec. 13, 2005

(54) ACTIVE PIXEL CELL USING NEGATIVE TO POSITIVE VOLTAGE SWING TRANSFER TRANSISTOR

(75) Inventors: Sohei Manabe, San Jose, CA (US); Hidetoshi Nozaki, San Jose, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 300 days.

(21) Appl. No.: 10/625,411

(22) Filed: Jul. 22, 2003

(65) Prior Publication Data

US 2005/0017155 A1    Jan. 27, 2005

(51) Int. Cl.[7] .............................................. H01L 27/00
(52) U.S. Cl. ............................... 250/208.1; 250/214 R
(58) Field of Search ......................... 250/208.1, 214 R, 250/214.1; 257/291, 440, 288; 348/308, 348/294

(56) References Cited

U.S. PATENT DOCUMENTS

| | | | |
|---|---|---|---|
| 5,625,210 A | 4/1997 | Lee | |
| 5,869,857 A | 2/1999 | Chen | |
| 6,064,053 A | * 5/2000 | Chi | ............... 250/208.1 |
| 6,180,969 B1 | 1/2001 | Yang | |
| 6,218,691 B1 | 4/2001 | Chung | |
| 6,329,679 B1 | 12/2001 | Park | |
| 6,441,412 B2 | 8/2002 | Oh | |
| 6,469,332 B1 | 10/2002 | Berezin | |
| 6,531,725 B2 | 3/2003 | Lee | |

FOREIGN PATENT DOCUMENTS

EP    0738010    10/1996

OTHER PUBLICATIONS

Ramaswami, S, et al., "Characterization of Pixel Response Time and Image Lag in CMOS Sensors", pp. 1-4, Image Capture Operation, Motorola Inc., Chandler, AZ.

* cited by examiner

*Primary Examiner*—Que T. Le
(74) *Attorney, Agent, or Firm*—Perkins Coie LLP

(57) ABSTRACT

A active pixel sensor cell is disclosed that comprises a pinned photodiode. A transfer transistor is placed between the pinned photodiode and an output node, the transfer transistor being a depletion mode N-type MOSFET. A reset transistor is coupled between a high voltage rail $V_{dd}$ and the output node. Finally, an output transistor has its gate coupled to the output node.

9 Claims, 3 Drawing Sheets

ACTIVE PIXEL CELL USING NEGATIVE TO POSITIVE VOLTAGE SWING TRANSFER TRANSISTOR

TECHNICAL FIELD OF THE INVENTION

The present invention relates to active pixels used in CMOS image sensors, and more particularly, to a low voltage pinned photodiode.

BACKGROUND OF THE INVENTION

Integrated circuit technology has revolutionized various fields, including computers, control systems, telecommunications, and imaging. In the field of imaging, the charge coupled device (CCD) has been made popular by its manufacturing and performance characteristics, including its relatively low cost and small size. Nevertheless, the solid state CCD integrated circuits needed for imaging are relatively difficult to manufacture, and therefore are expensive. In addition, because of the differing processes involved in the manufacture of the CCD integrated circuits relative to MOS integrated circuits, the signal processing portion of the imaging sensor has typically been located on a separate integrated chip. Thus a CCD imaging device includes at least two integrated circuits: one for the CCD sensor and one for the signal processing logic.

Another class of image sensors are the CMOS active pixel sensors. As noted in U.S. Pat. No. 5,625,210 to Lee et al. ("the '210 patent), an active pixel sensor refers to an electronic image sensor with active devices, such as transistors, that are associated with each pixel. The active pixel sensor has the advantage of being able to incorporate both signal processing and sensing circuitry within the same integrated circuit because of the CMOS manufacturing techniques.

One popular active pixel sensor structure consists of four transistors and a pinned photodiode. The pinned photodiode has gained favor for its ability to have good color response for blue light, as well as advantages in dark current density and image lag. Reduction in dark current is accomplished by pinning the diode surface potential to the Pwell or Psubstrate (GND) through a P+ region.

In general, it is desirable to accumulate as much charge in the photodiode as possible to increase the signal level. However, with an increased signal level (resulting from more accumulated charge), this may cause image lag due to the incomplete transfer of mobile charge from the diode to the floating output node, if the junction profile is not perfectly optimized for the charge transfer. This is also referred to as incomplete reset or incomplete depletion of the N-well of the pinned photodiode. A discussion of this phenomena can be found in "Characterization of Pixel Response Time and Image Lag in CMOS Sensors" by Ramaswami et al. The non-fully depleted state of the N-well is particularly evident with low voltage operation (for example 2.5 volts or lower). Low-voltage operation is becoming more and more prevalent as integrated circuit devices shrink and gate oxides become thinner.

Therefore, it is desirable to have an active pixel using a pinned photodiode that has high charge accumulation capabilities, yet complete reset of the photodiode even with low voltage operation.

BRIEF DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein.

DETAILED DESCRIPTION OF THE PREFERRED EMBODIMENT

The present invention relates to an active pixel design for use with image sensors. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
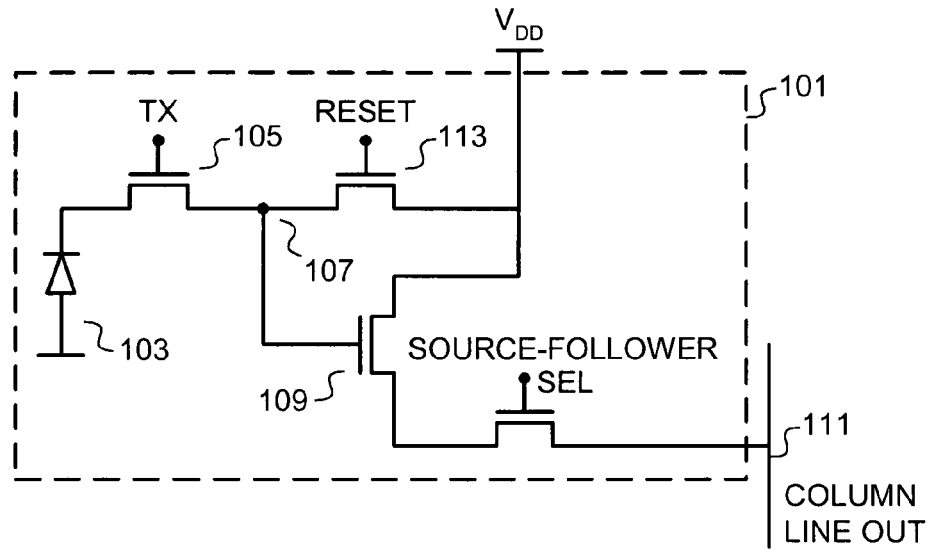
FIG. 1 is a schematic diagram of a prior art active pixel.
Figure 2:
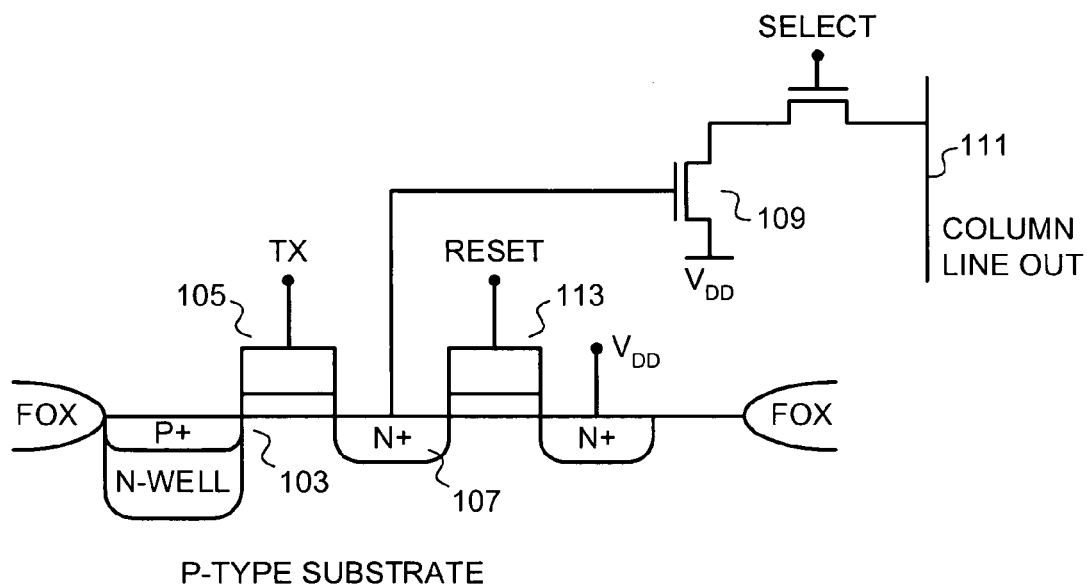
FIG. 2 is a cross section view of the prior art active pixel of FIG. 1.

FIGS. 1 and 2 show a prior art active pixel 101 with pinned photodiode 103. The pinned photodiode 103 is a N-well formed in a p-type substrate. A P+ region is formed atop of the N-well. A transfer gate (also referred to as a transfer transistor) controls the transfer of the signal from the pinned photodiode 103 to an output node 107. The output node 107 is connected to the gate of a source-follower transistor 109 (also referred to as a drive or output transistor). This results in the signal on the output node 107 being amplified and placed onto the column line out 111. A row select transistor (SEL) is used to select the particular pixel to be read out on the column line out 111. The row select transistor is controlled by a row select line. Further, a reset transistor 113 is used to deplete the signal in the pinned photodiode.

The present invention modifies the prior art pinned photodiode of FIGS. 1 and 2 to allow for low-voltage operation, while having good depletion characteristics. The pinned photodiode of the present invention is formed using the standard CMOS fabrication process. In the description below, the preferred dopant for N type implant is Phosphorus, while the preferred dopant for a P type implant is Boron.

In many respects the structure of the pinned photodiode of the present invention is similar to that shown in FIGS. 1 and 2. In typical operation, the transfer gate 105 (for the prior art) swings from zero volts to $V_{dd}$. For image sensors that use a 5.0 volt or 3.3 volt $V_{dd}$ "rail", this results in a 5 or 3.3 volt swing. This amount of voltage swing has previously been acceptable for depleting the photodiode 103.

However, for newer integrated circuit processes, the $V_{dd}$ voltage may be 1.8 volts, 1.3 volts, or even lower. In such a situation, the voltage swing on the gate of the transfer gate is oftentimes insufficient to deplete the photodiode.

Figure 3:
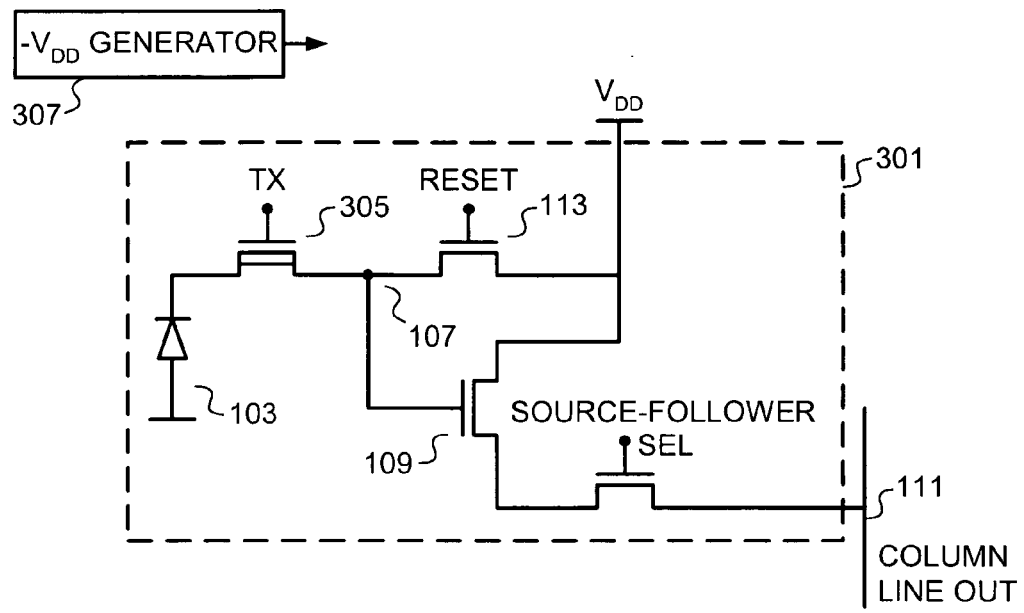
FIG. 3 is a schematic diagram of an active pixel formed in accordance with the present invention.
Figure 4:
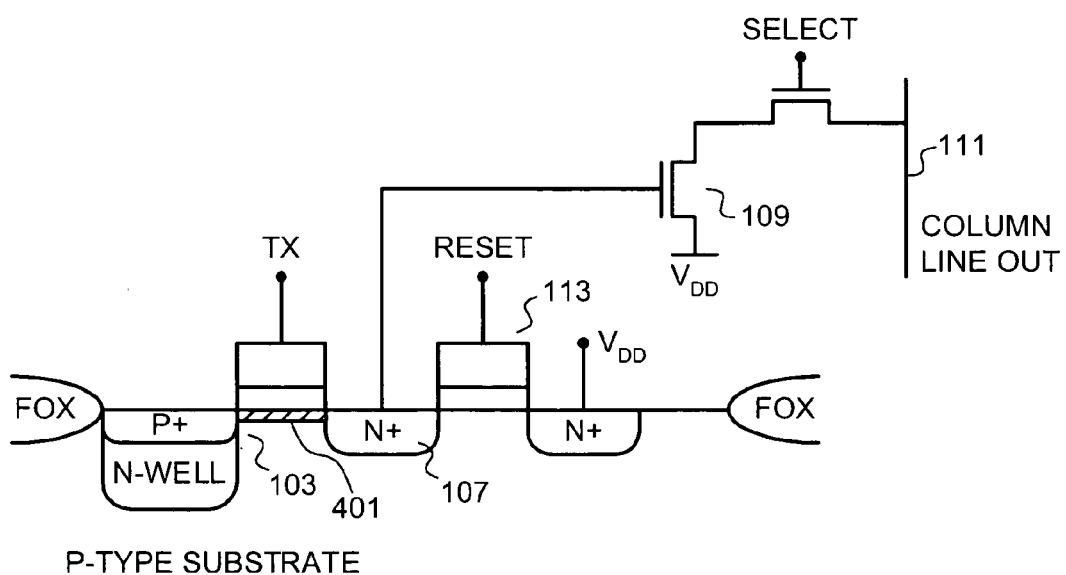
FIG. 4 is a cross section view of the active pixel of FIG. 3.

Turning to FIG. 3, a schematic diagram of an active pixel 301 formed in accordance with the present invention is shown. A partial cross section view is shown in FIG. 4. The active pixel 301 in many respects is similar to the one shown in FIG. 1. However, as seen, a depletion mode transfer gate 305 is used in the active pixel 301. The depletion mode transfer gate 305 (assuming an NMOS transistor) is typically formed by implanting N-type impurities underneath the gate of the depletion mode transfer gate 305. The implanted N-type impurities are shown in FIG. 4 by reference number 401. Further, it can be appreciated that the polarities of the dopants discussed herein can be reversed.

Because of the use of the depletion mode transfer gate 305, the transfer gate is conducting even at 0 volts. Therefore, in order to operate the active pixel 301, the transfer gate 305 has its gate held at some negative voltage during the integration (light gathering) period. In one embodiment, the negative voltage is $-V_{dd}$. However, it can be appreciated that the precise magnitude of the negative voltage may vary, but the negative magnitude should be greater than the negative threshold voltage of the depletion mode transfer gate 305.

As one example, if the depletion mode transfer gate 305 has a threshold voltage of –0.9 volts, further with an on-chip rail of $V_{dd}$ of 1.8 volts, then the gate of the depletion mode transfer gate 305 may be held from anywhere between –1.8 volts and –0.9 volts. It is more convenient however to use the full $-V_{dd}$ voltage since it is more readily available on the integrated circuit, such as by means of a charge pump. Further, as will be seen in greater detail below, in some embodiments, the threshold voltage of the depletion mode transfer gate 305 is designed to be near the value of $-V_{dd}$.

Because of the need to use a negative voltage to periodically keep the depletion mode transfer gate 305 in the off state, a $-V_{dd}$ generator 307 is provided on the integrated circuit. The signal from the $-V_{dd}$ generator 307 is selectively applied to the gate of the depletion mode transfer gate 305 during the integration and reset phases of the pixel operation.

Thus, during standard operation of the depletion mode transfer gate 305, the gate of the depletion mode transfer gate 305 can swing from $-V_{dd}$ to $V_{dd}$. This is twice the amount of voltage swing available in the prior art transfer gate of FIG. 1, which uses an enhancement mode transfer gate 105. As can be seen, the voltage swing is provided while maintaining low-voltage operation.

The relatively large voltage swing by the use of a depletion mode transfer gate 305 as compared to an enhancement mode transfer gate is advantageous. First, the large voltage swing allows for the pinned photodiode 103 to be more easily depleted during the reset stage. Second, it is believed that the use of a depletion mode transfer gate 305 allows hole accumulation to occur at the surface near the transfer gate 305, thereby reducing leakage current.

Figure 5:
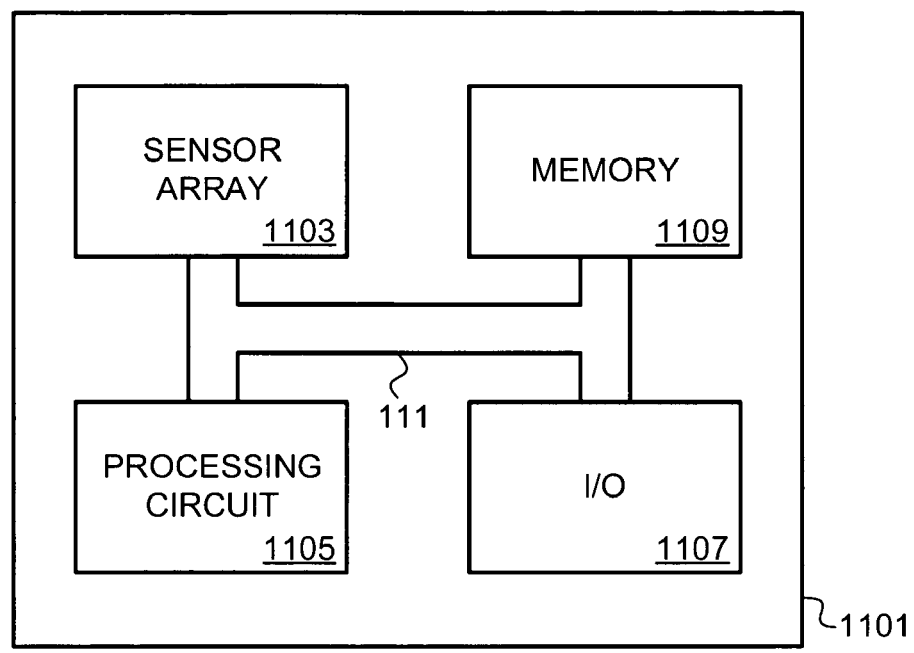
FIG. 5 is a block diagram of an CMOS image sensor.

The active pixels described above may be used in a sensor array of a CMOS image sensor 1101. Specifically, FIG. 5 shows a CMOS image sensor formed in accordance with the present invention. The CMOS image sensor includes a sensor array 1103, a processor circuit 1105, an input/output (I/O) 1107, memory 1109, and bus 1111. Preferably, each of these components is formed on a single silicon substrate and manufactured to be integrated onto a single chip using standard CMOS processes.

The sensor array 1103 portion may be, for example, substantially similar to the sensor arrays portions of image sensors manufactured by the assignee of the present invention, OmniVision Technologies, Inc., of Sunnyvale, Calif. as model numbers OV7630, OV7920, OV7930, OV9620, OV9630, OV6910, or OV7640, except that the pixels are replaced with the active pixels disclosed herein.

More specifically, the sensor array 1103 includes a plurality of individual pixels arranged in a two-dimensional array. In operation, as an image is focused onto the sensor array 1103, the sensor array 1103 can obtain the raw image data.

The raw image data is then received by the processor circuit 1105 via bus 1111 to begin signal processing. The processor circuit 1105 is capable of executing a set of preprogrammed instructions (perhaps stored in memory 1107) necessary to carry out the functions of the integrated circuit 1101. The processor circuit 1105 may be a conventional microprocessor, DSP, FPGA or a neuron circuit.

While the preferred embodiment of the invention has been illustrated and described, it will be appreciated that various changed can be made therein without departing from the spirit and scope of the invention. For example, while it is also understood where the device has generally been shown using different types of P or N type materials, the types of materials could be switched to produce similar results. For example, rather than the P+/Nwell/Psub pinned photodiode that was formed, the alternate types of materials could be used to form a N+/Pwell/Nsub photodiode.

Also, rather than being implemented in a four transistor active pixel sensor, other styles of active pixel sensors could be used, such as a two transistor, a four transistor, or a log scale implementation. As previously noted, some examples of general prior art design approaches to these other styles are shown in U.S. Pat. Nos. 5,587,596; 5,926,214; and 5,933,190.

The present invention has thus been described in relation to a preferred and several alternate embodiments. One of ordinary skill after reading the foregoing specification will be able to affect various changes, alterations, and substitutions of equivalents without departing from the broad concepts disclosed. It is therefore intended that the scope of the letters patent granted hereon be limited only by the definitions contained in appended claims and equivalents thereof, and not by limitations of the embodiments described herein.

The embodiments of the invention in which an exclusive property or privilege is claimed are defined as follows:

1. A pixel sensor cell comprising:
   a pinned photodiode;
   a transfer transistor placed between the pinned photodiode and an output node, the transfer transistor being a depletion mode NMOS transistor;
   a reset transistor coupled between a high voltage rail $V_{dd}$ and the output node;
   an output transistor, the gate of the output transistor being couple to the output node; and
   said pixel sensor cell formed on an integrated circuit having a negative voltage generator that generates a negative voltage sufficient to turn off said depletion mode transfer transistor such that charge from said pinned photodiode cannot flow to said output node.

2. The pixel sensor cell of claim 1 further including a row select transistor, the gate of the row select transistor being coupled to a row select line, the input of the row select transistor being coupled to the output of the output transistor, and the output of the row select transistor providing the output of the pixel sensor cell.

3. The pixel sensor cell of claim 1, wherein the output node is the source of the transfer transistor and said pinned photodiode is the drain of said transfer transistor.

4. The pixel sensor cell of claim 1, wherein said negative voltage generator generates a $-V_{dd}$ voltage that is applied to said transfer transistor to completely turn off said transfer transistor.

5. The pixel sensor cell of claim 1, wherein the pinned photodiode is a P+/Nwell/Psub structure.

6. The pixel sensor cell of claim 1, wherein the pinned photodiode is a N+/Pwell/Nsub structure.

7. A method of operating an active pixel, the pixel cell including a pinned photodiode, a transfer transistor placed between the pinned photodiode and an output node, the transfer transistor being a depletion mode NMOS transistor, a reset transistor coupled between a high voltage rail $V_{dd}$ and the output node, and an output transistor, the gate of the output transistor being coupled to the output node, the method comprising:

during an integration period, holding said transfer transistor to a negative voltage such that said transfer transistor is completely off; and during a transfer period, using a positive voltage to turn on said transfer transistor to allow charge from said photodiode to flow to said output node.

8. The method of claim 7 wherein said negative voltage is $-V_{dd}$ and which is generated by an on chip charge pump.

9. The method of claim 8 wherein said positive voltage is $V_{dd}$ such that the swing from the transfer transistor being on and off is between $-V_{dd}$ to $V_{dd}$.

* * * * *

UNITED STATES PATENT AND TRADEMARK OFFICE
CERTIFICATE OF CORRECTION

PATENT NO. : 6,974,943 B2
DATED : December 13, 2005
INVENTOR(S) : Sohei Manabe et al.

It is certified that error appears in the above-identified patent and that said Letters Patent is hereby corrected as shown below:

Column 4,
Line 59, "couple" should be -- coupled --.

Signed and Sealed this

Fourteenth Day of March, 2006

JON W. DUDAS
*Director of the United States Patent and Trademark Office*